United States Patent
Chen et al.

(10) Patent No.: US 12,300,511 B1
(45) Date of Patent: May 13, 2025

(54) FABRICATION METHOD FOR PACKAGE STRUCTURE

(71) Applicants: University of Electronic Science and Technology of China, Sichuan (CN); Zhuhai YUEXIN Semiconductor Limited Liability Company, Guangdong (CN)

(72) Inventors: Xianming Chen, Guangdong (CN); Yuanming Chen, Guangdong (CN); Lei Feng, Guangdong (CN); Benxia Huang, Guangdong (CN); Yongzhi Zeng, Guangdong (CN); Wei He, Guangdong (CN); Yanlin Dong, Guangdong (CN)

(73) Assignees: University of Electronic Science and Technology of China, Sichuan (CN); Zhuhai YUEXIN Semiconductor Limited Liability Company, Guangdong (CN)

( * ) Notice: Subject to any disclaimer, the term of this patent is extended or adjusted under 35 U.S.C. 154(b) by 0 days.

(21) Appl. No.: 19/021,887

(22) Filed: Jan. 15, 2025

(30) Foreign Application Priority Data

Dec. 5, 2024 (CN) .......................... 202411783224.4

(51) Int. Cl.
*H01L 21/48* (2006.01)
*H01L 23/00* (2006.01)

(52) U.S. Cl.
CPC .......... *H01L 21/4853* (2013.01); *H01L 24/83* (2013.01); *H01L 24/85* (2013.01); *H01L 24/29* (2013.01); *H01L 24/73* (2013.01); *H01L 2224/29611* (2013.01); *H01L 2224/29655* (2013.01); *H01L 2224/29666* (2013.01); *H01L 2224/73265* (2013.01); *H01L 2224/83192* (2013.01); *H01L 2224/85986* (2013.01); *H01L 2924/15153* (2013.01)

(58) Field of Classification Search
CPC ............................................. H01L 2224/32225
See application file for complete search history.

(56) References Cited

U.S. PATENT DOCUMENTS

| | | | |
|---|---|---|---|
| 2005/0087864 A1* | 4/2005 | Yang | H01L 23/36 257/E23.079 |
| 2021/0050288 A1* | 2/2021 | Wang | H01L 21/4857 |
| 2022/0346218 A1* | 10/2022 | Li | H05K 1/0204 |

* cited by examiner

*Primary Examiner* — Yu-Hsi D Sun
(74) *Attorney, Agent, or Firm* — The PL Law Group, PLLC

(57) ABSTRACT

In a fabrication method for a package structure, a copper foil is provided, electroplating is performed on the copper foil to form a cavity sacrificial post, a dielectric material is laminated to form a dielectric layer, wherein an end face of the cavity sacrificial post is exposed to the dielectric layer, a wiring layer is formed on the dielectric layer, the cavity sacrificial post is removed by etching to form a through cavity, a bonding pad is formed on the wiring layer, a reverse side of a device is mounted on the copper foil in the through cavity, and a terminal of the device is wire-bonded with the bonding pad.

10 Claims, 4 Drawing Sheets

FABRICATION METHOD FOR PACKAGE STRUCTURE

CROSS-REFERENCE TO RELATED APPLICATION AND CLAIM OF PRIORITY

This application claims the benefit under 35 USC § 119 of Chinese Patent Application No. 2024117832244, filed on Dec. 5, 2024, in the China Intellectual Property Office, the entire disclosure of which is incorporated herein by reference for all purposes.

BACKGROUND

1. Technical Field

The present disclosure relates to the technical field of semiconductor package, in particular to a fabrication method for a package structure.

2. Background Art

With the development and progress of an electronic technology, functions of electronic products are becoming more and more powerful, and appearances of the electronic products are evolving to be short and thin, which promotes package structures of electronic products to develop towards high integration and miniaturization, and thus, embedded package of chips and other devices emerges. At the same time, performances of electronic devices are also developing towards high frequency, high speed and high power, which leads to the rapid increment of a heat flux per unit area. As we all know, with the rise of an operating ambient temperature, operating speeds of the electronic devices are reduced, and the loss is increased; at the same time, due to long-time operation in a high-temperature environment, the reliability of the electronic products is relatively lowered. If heat generated by the electronic devices with high frequency, high speed and high power cannot be radiated in time, the performances and reliability of the electronic products will be seriously affected. Therefore, how to reasonably optimize the design of an embedded package substrate and a package body to improve a heat radiation performance of an embedded package structure under the mega-trends of high frequency, high speed and high power has been an important issue at present.

SUMMARY

In view of this, an object of the present disclosure is to provide a fabrication method for a package structure.

Based on the above-mentioned object, the present disclosure provides a fabrication method for a package structure, including:
(a) providing a copper foil;
(b) performing electroplating on the copper foil to form a cavity sacrificial post;
(c) laminating a dielectric material to form a dielectric layer, wherein an end face of the cavity sacrificial post is exposed to the dielectric layer;
(d) forming a wiring layer on the dielectric layer;
(e) removing the cavity sacrificial post by etching to form a through cavity;
(f) forming a bonding pad on the wiring layer; and
(g) mounting a reverse side of a device on the copper foil in the through cavity, and wire-bonding a terminal of the device with the bonding pad.

In some embodiments, a distance from an end face of the terminal to the copper foil is the same as a distance from an end face of the bonding pad to the copper foil.

In some embodiments, before step (f), the fabrication method further includes: forming a stump on the wiring layer.

In some embodiments, the fabrication method further includes:
(h) forming a package layer, wherein an end face of the stump is exposed to the package layer.

In some embodiments, the fabrication method further includes:
(i) forming a soldering layer on the end face of the stump.

In some embodiments, before step (b), the fabrication method further includes: forming a protective layer on the copper foil; wherein the protective layer is located between the cavity sacrificial post and the copper foil.

In some embodiments, the protective layer is made of one or more of nickel, titanium and tin.

In some embodiments, step (e) includes:
(e1) performing lamination, exposure and development of a dry film photoresist to form a photoresist layer to which the cavity sacrificial post is exposed;
(e2) vacuum-etching the cavity sacrificial post to form the through cavity; and
(e3) removing the photoresist layer.

In some embodiments, step (f) includes:
forming a surface treatment layer on the wiring layer.

In some embodiments, the surface treatment layer is formed by a nickel electroless palladium immersion gold process.

It can be seen from above that a fabrication method for a package structure provided in the present disclosure includes: (a) providing a copper foil; (b) performing electroplating on the copper foil to form a cavity sacrificial post; (c) laminating a dielectric material to form a dielectric layer, wherein an end face of the cavity sacrificial post is exposed to the dielectric layer; (d) forming a wiring layer on the dielectric layer; (e) removing the cavity sacrificial post by etching to form a through cavity; (f) forming a bonding pad on the wiring layer; and (g) mounting a reverse side of a device on the copper foil in the through cavity, and wire-bonding a terminal of the device with the bonding pad. By adopting such a fabrication method, the device is directly mounted on the copper foil, and the copper foil becomes a large-area heat radiator capable of rapidly taking away heat generated during the operation of the device, so that a heat radiation performance of an embedded package structure is greatly improved.

BRIEF DESCRIPTION OF THE DRAWINGS

In order to describe the technical solutions in the present disclosure or the prior art more clearly, the accompanying drawings that are to be referred for description of the embodiments or the related art will be briefly described hereinafter. Apparently, the accompanying drawings described hereinafter only illustrate the embodiments of the present disclosure, and those of ordinary skill in the art can further derive other accompanying drawings from these accompanying drawings without creative efforts. In the accompanying drawings, in order to better understand and facilitate description, the thickness and shapes of some layers and areas can be exaggerated.

DETAILED DESCRIPTION OF THE EMBODIMENTS

Figure 1A:
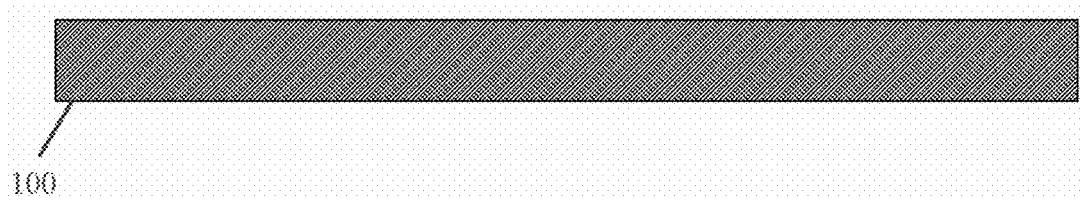
FIG. 1A to FIG. 1J are schematic sectional diagrams of intermediate structures in all steps of a fabrication method for a package structure provided in an embodiment of the present disclosure.

In order to make objects, technical solutions and advantages of the present disclosure clearer and more understandable, the present disclosure will be further described in detail below in conjunction with specific embodiments and with reference to the accompanying drawings.

It should be noted that unless otherwise defined, technical terms or scientific terms used in the embodiments of the present disclosure should be ordinary meanings as understood by those of ordinary skill in the art to which the present disclosure belongs. The words "first", "second" and similar terms used in the embodiments of the present disclosure do not denote any order, quantity or importance, but are only used to distinguish different devices. The word "including" or "comprises" or a similar word means that an device or object preceding the word covers an device or object listed after the word and its equivalent, without excluding other devices or objects. The words "connection" or "connected" and similar words are not limited to physical or mechanical connection, but can include electrical connection no matter whether it is direct or indirect. Terms "upper", "lower", "left" and "right" are only used to denote relative positional relationships, and after an absolute position of a described object is changed, the relative positional relationships may also be changed correspondingly.

In the related art, embedded package is to mount chips and other devices in a polymer frame or a core plate of a preset cavity and then press-fit a dielectric material to achieve package. Due to the limitation of the heat radiation property of an organic polymer material, it is difficult to fundamentally solve the problem of heat radiation of embedded products with high frequency, high speed and high power.

In order to solve the problem of the heat radiation of the embedded products, a technology for achieving package by preprocessing a cavity in a metal (such as copper) plate, then, mounting a device such as a chip in the preset cavity, and then laminating a dielectric material attracts more attention. However, such a solution is complex in processing process and high in cost.

In view of this, an embodiment of the present disclosure provides a fabrication method for a package structure. The fabrication method includes: (a) a copper foil is provided; (b) electroplating is performed on the copper foil to form a cavity sacrificial post; (c) a dielectric material is press-fitted to form a dielectric layer, wherein an end face of the cavity sacrificial post is exposed to the dielectric layer; (d) a wiring layer is formed on the dielectric layer; (e) the cavity sacrificial post is removed by etching to form a through cavity; (f) a bonding pad is formed on the wiring layer; and (g) a reverse side of a device is mounted on the copper foil in the through cavity, and a terminal of the device is wire-bonded with the bonding pad. By such a fabrication method, the device is directly mounted on the copper foil, and the copper foil becomes a large-area heat radiator capable of rapidly taking away heat generated during the operation of the device, so that a heat radiation performance of an embedded package structure is greatly improved.

FIG. 1A to FIG. 1J are schematic sectional diagrams of intermediate structures in all steps of a fabrication method for a package structure provided in an embodiment of the present disclosure. As shown in FIG. 1A to FIG. 1J, the fabrication method includes:

firstly, step (a): a copper foil 100 is provided, as shown in FIG. 1A. Herein, the thickness of the copper foil can be 200 μm.

Figure 1B:
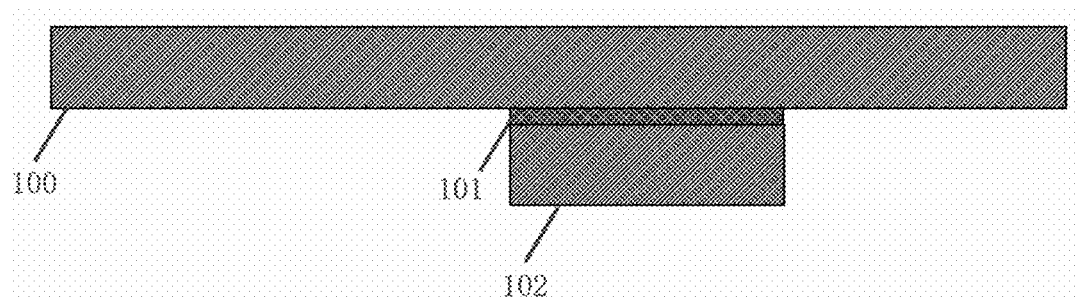

Next, step (b): electroplating is performed on the copper foil 100 to form a protective layer 101 and a cavity sacrificial post 102, as shown in FIG. 1B. Optionally, the protective layer 101 is a metal etching protective layer, and the protective layer 101 is made of one or more of nickel, titanium and tin. Optionally, the cavity sacrificial post 102 can be a copper post.

In some embodiments, step (b) specifically includes: dry-film pasting, exposure and development are performed on one surface of the copper foil 100 to form a first pattern layer; next, electroplating is performed to form the protective layer 101; then, electroplating is performed to form the cavity sacrificial post 102; and finally, the first pattern layer is removed to obtain the protective layer 101 and the cavity sacrificial post 102.

Figure 1C:
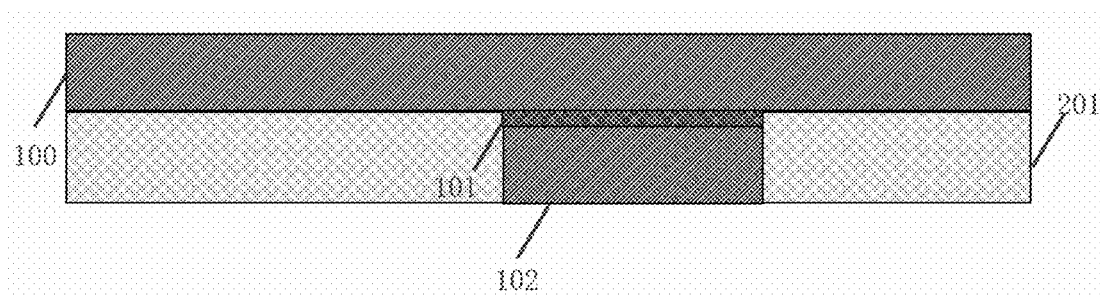

Then, step (c): a dielectric material is laminated to form a dielectric layer 201, wherein an end face of the cavity sacrificial post 102 is exposed to the dielectric layer 201, as shown in FIG. 1C. It should be noted that the technical effect of exposing the end face of the cavity sacrificial post 102 also can be achieved by mechanical grounding.

Figure 1D:
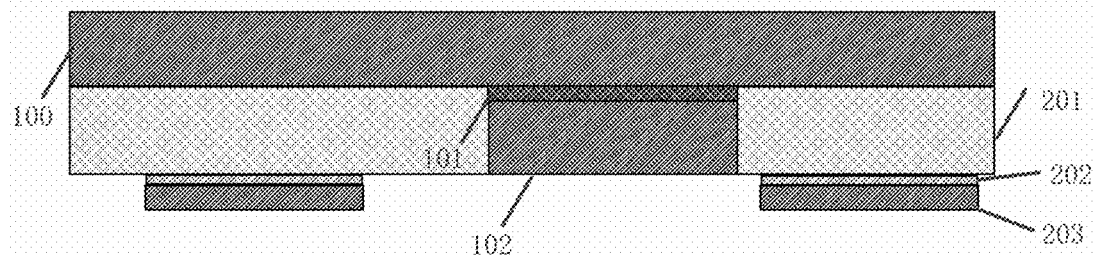

Next, step (d): a wiring layer 203 is formed on the dielectric layer 201, as shown in FIG. 1D.

In some embodiments, step (d) specifically includes: a metal seed layer 202 is fabricated on the dielectric layer 201; next, dry-film pasting, exposure and development are performed to form a second pattern layer; then, electroplating is performed; and finally, the second pattern layer is removed, and the metal seed layer 202 is etched to form the wiring layer 203.

Figure 1E:
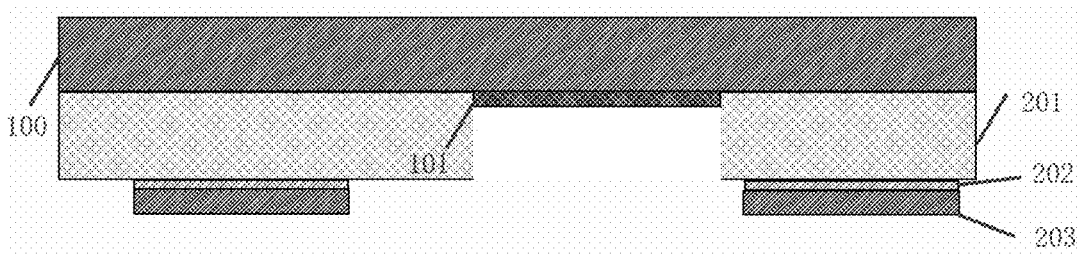

Then, step (e): the cavity sacrificial post 102 is removed by etching to form a through cavity, as shown in FIG. 1E.

In some embodiments, step (e) can include: (e1) lamination, exposure and development of a dry film photoresist are performed to form a photoresist layer to which the cavity sacrificial post 102 is exposed; then, (e2) the cavity sacrificial post 102 is vacuum-etched to form the through cavity; and finally, (e3) the photoresist layer is removed. Herein, the protective layer 101 can prevent the copper foil 100 from being etched and play a role in protecting the copper foil 100.

Figure 1F:
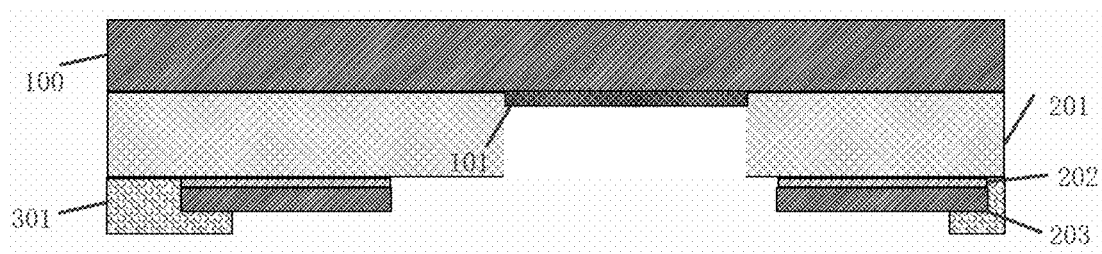

Next, step (f): a solder mask 301 is fabricated, as shown in FIG. 1F. Herein, parts of the wiring layer 203 are exposed to the solder mask 301. It should be noted that the solder mask 301 may not overlap with the subsequent bonding pad 304 and stump 302.

In some embodiments, step (f) includes: firstly, resistance soldering and wire printing are performed; next, exposure and development are performed; then, nitrogen gas baking is performed; and finally, ultraviolet light curing is performed to form the solder mask 301.

Figure 1G:
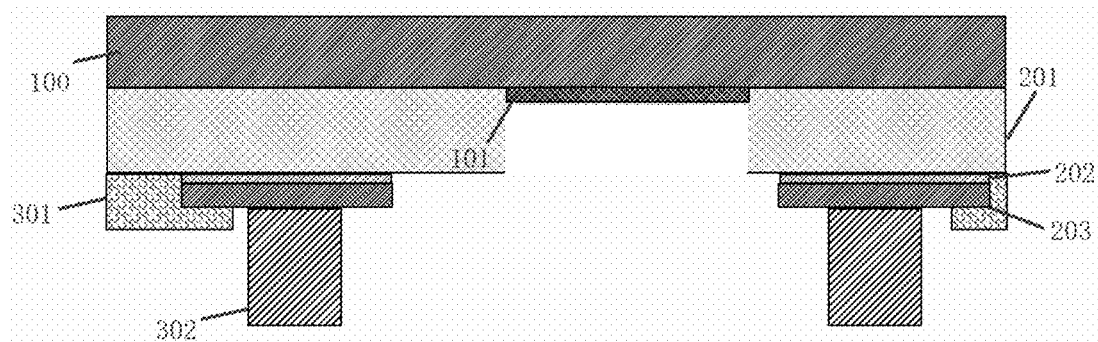

Then, step (g): a stump 302 is formed on the wiring layer 203, as shown in FIG. 1G. Optionally, the stump 302 is fabricated by electroplating. Specifically, the stump 302 can be fabricated by performing dry-film pasting, exposure and development to form a third pattern layer, then, performing electroplating, and finally, removing the third pattern layer.

Figure 1H:
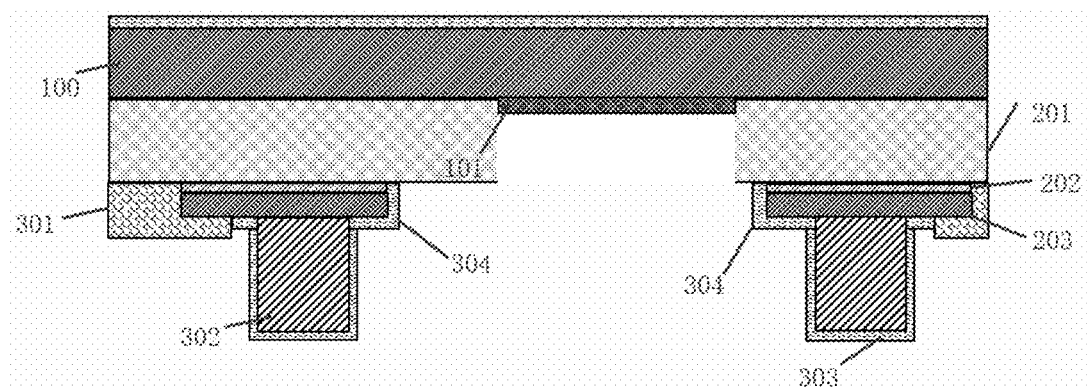

Next, step (h): a surface treatment layer 303 is formed on the wiring layer 203 and the stump 302, and the surface-treated wiring layer 203 forms a bonding pad 304, as shown in FIG. 1H.

Optionally, the surface treatment layer 303 is formed by Electroless Nickel Electroless Palladium Immersion Gold (ENEPIG) process.

Figure 1I:
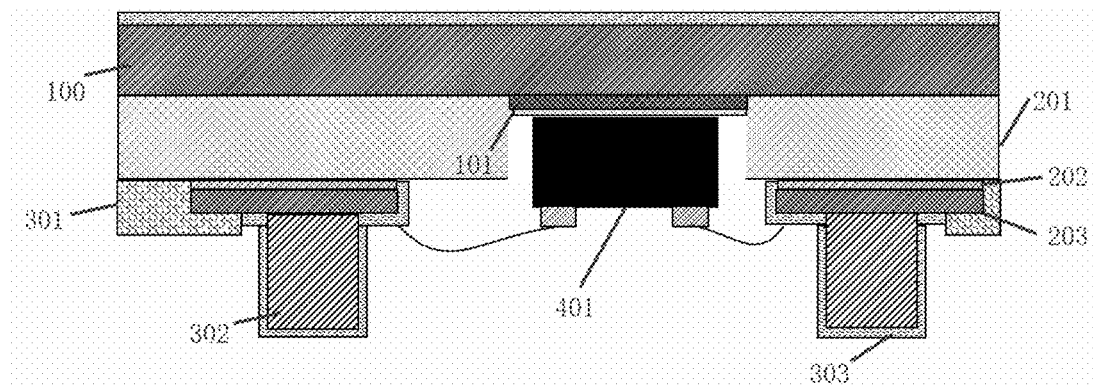

Then, step (i): a reverse side of a device 401 is mounted on the protective layer 101 in the through cavity, and a terminal of the device 401 is wire-bonded with the bonding pad 304, as shown in FIG. 1I. The device 401 is in direct contact with the copper foil 100, which facilitates rapidly taking away heat generated during the operation of the device 401, so that a heat radiation performance of an embedded package structure is greatly improved.

In some embodiments, the device 401 can be mounted by using a gluing material such as epoxy resin, which is not limited in the present disclosure.

Optionally, the depth of the through cavity and the thickness of the bonding pad 304 are controlled, so that a distance from an end face of the terminal of the device 401 to the copper foil 100 is the same as a distance from an end face of the bonding pad 304 to the copper foil. In other words, the end face of the terminal of the device 401 and the end face of the bonding pad 304 are located on the same height, so that the inductance loss brought by a lead arc can be reduced, and the stability of the overall performance of the package structure can be improved.

The device 401 can be an active device (such as a transistor, an IC device, a logic circuit, and a power amplifier) or a passive device (such as a capacitor, an inductor, and a resistor), which is not limited in the present disclosure.

Figure 1J:
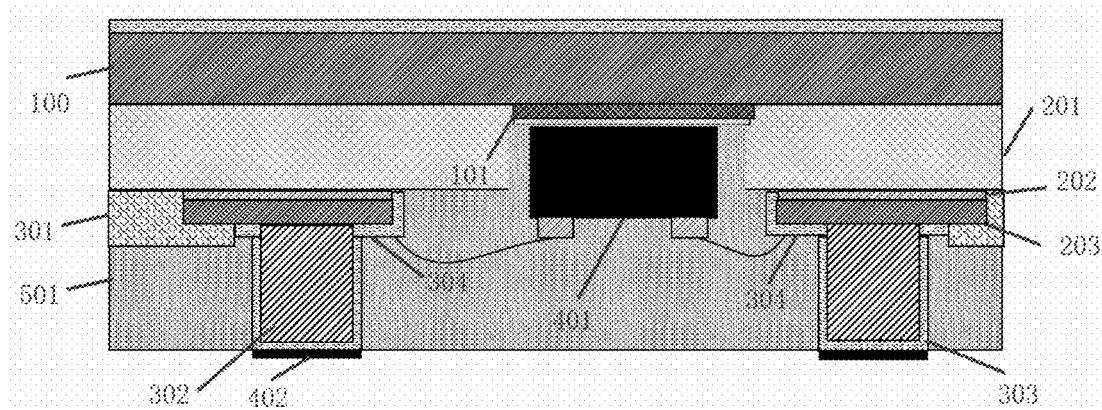

Next, step (j): package is performed by using a plastic package material to form a package layer 501, as shown in FIG. 1J. Herein, the package layer is ground to expose the end face of the stump 302.

Finally, step (k): a soldering layer 402 used as a pin of the package structure is formed on the end face of the stump 302, as shown in FIG. 1J.

Figure 2:
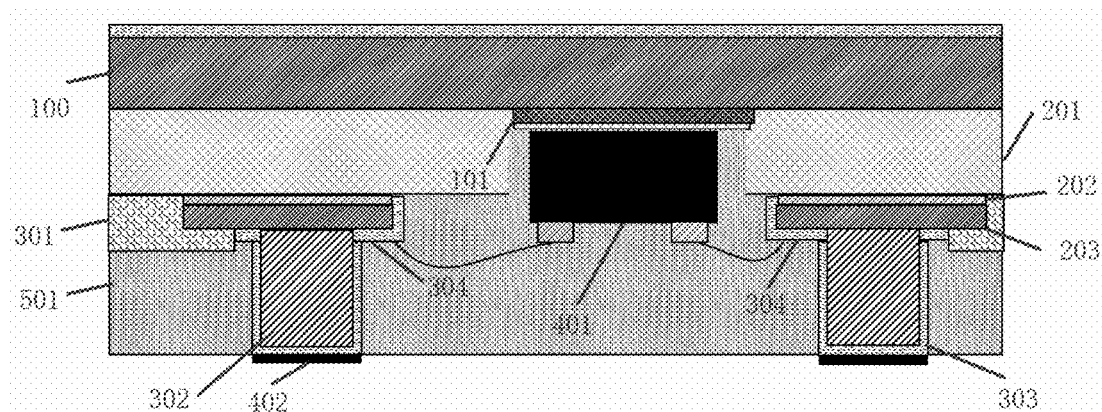
FIG. 2 is a schematic diagram of a package structure provided in an embodiment of the present disclosure.

A package structure prepared by foregoing step (a) to step (k) is shown in FIG. 2. As shown in FIG. 2, the package structure includes a copper foil 100, a dielectric layer 201, a wiring layer 203, a bonding pad 304, and a device 401; wherein the dielectric layer 201 and the wiring layer 203 are sequentially disposed on the copper foil 100; the dielectric layer 201 includes a through cavity, and the device 401 is disposed on the copper foil 100 in the through cavity; and the bonding pad 304 is disposed on the wiring layer 203, and a terminal of the device 401 is connected to the bonding pad 304 by a lead. Further, the wiring layer 203 is further provided with a stump 302 and a package layer 501, wherein the stump 302 can be a copper post. An end face of the stump 302 is exposed to the package layer 501. Optionally, a soldering layer 402 is disposed on the end face of the stump 302. Therefore, by taking the stump 302 as a pin of the package structure, the layout flexibility of the package structure can be improved.

In some embodiments, a protective layer 101 made of metal is further disposed between the copper foil 100 and the device 401. The protective layer 101 can protect the copper foil 100 from being etched during the fabrication of the package structure, and at the same time, the heat radiation of the device 401 via the copper foil 100 is not affected.

In some embodiments, a distance from an end face of the terminal of the device 401 and the copper foil 100 is the same as a distance from an end face of the bonding pad 304 to the copper foil 100. For such a structure, the radian of a lead between the terminal of the device 401 and the bonding pad 304 is small, so that the inductance loss brought by a lead arc can be reduced, and the stability of the overall performance of the package structure can be improved.

It should be understood by those of ordinary skill in the art that the discussion in any one of the above embodiments is only exemplary, and is not intended to imply that the scope (including the claims) of the present disclosure is limited to these examples; and under the idea of the present disclosure, technical features in the above embodiments or different embodiments can also be combined, steps therein can be implemented in any order, and there are other changes in different aspects of the above-mentioned embodiments of the present disclosure, however, for concision, they are not provided in detail.

The embodiments of the present disclosure are intended to cover all such substitutions, modifications and variations falling within the wide scope of the appended claims. Therefore, any omissions, modifications, equivalent substitutions and improvements and the like within spirits and principles of the embodiments of the present disclosure shall fall within the protective scope of the present disclosure.

What is claimed is:

1. A fabrication method for a package structure, comprising:
   (a) providing a copper foil;
   (b) performing electroplating on the copper foil to form a cavity sacrificial post;
   (c) laminating a dielectric material to form a dielectric layer, wherein an end face of the cavity sacrificial post is exposed to the dielectric layer;
   (d) forming a wiring layer on the dielectric layer;
   (e) removing the cavity sacrificial post by etching to form a through cavity;
   (f) forming a bonding pad on the wiring layer; and
   (g) mounting a reverse side of a device on the copper foil in the through cavity, and wire-bonding a terminal of the device with the bonding pad.

2. The fabrication method of claim 1, wherein a distance from an end face of the terminal to the copper foil is the same as a distance from an end face of the bonding pad to the copper foil.

3. The fabrication method of claim 1, further comprising, before forming the bonding pad, forming a stump on the wiring layer.

4. The fabrication method of claim 3, further comprising:
   (h) forming a package layer, wherein an end face of the stump is exposed to the package layer.

5. The fabrication method of claim 4, further comprising:
   (i) forming a soldering layer on the end face of the stump.

6. The fabrication method of claim 1, further comprising, before performing the electroplating, forming a protective layer on the copper foil, wherein the protective layer is located between the cavity sacrificial post and the copper foil.

7. The fabrication method of claim 6, wherein the protective layer is made of one or more of nickel, titanium and tin.

8. The fabrication method of claim 1, wherein the removing of the cavity sacrificial post comprises:
   (e1) performing lamination, exposure and development of a dry film photoresist to form a photoresist layer to which the cavity sacrificial post is exposed;
   (e2) vacuum-etching the cavity sacrificial post to form the through cavity; and
   (e3) removing the photoresist layer.

9. The fabrication method of claim 1, wherein the forming of the bonding pad comprises:
   forming a surface treatment layer on the wiring layer.

10. The fabrication method of claim 9, wherein the surface treatment layer is formed by Electroless Nickel Electroless Palladium Immersion Gold (ENEPIG) process.

* * * * *